(12) United States Patent
Schripsema et al.

(10) Patent No.: US 7,183,669 B2
(45) Date of Patent: Feb. 27, 2007

(54) POWER AND/OR ENERGY MONITOR, METHOD OF USING, AND DISPLAY DEVICE

(75) Inventors: Jason Schripsema, Berkeley, CA (US); Jerome S. Culik, Nottingham, PA (US); Mark Mrohs, Northridge, CA (US); Allen Barnett, Landenberg, PA (US)

(73) Assignee: Heritage Power LLC, Atlanta, GA (US)

( * ) Notice: Subject to any disclaimer, the term of this patent is extended or adjusted under 35 U.S.C. 154(b) by 175 days.

(21) Appl. No.: 10/776,922

(22) Filed: Feb. 11, 2004

(65) Prior Publication Data

US 2005/0001486 A1    Jan. 6, 2005

Related U.S. Application Data

(63) Continuation of application No. PCT/US02/25876, filed on Aug. 13, 2002.

(60) Provisional application No. 60/311,881, filed on Aug. 13, 2001.

(51) Int. Cl.
*H02J 7/00* (2006.01)
(52) U.S. Cl. .......................................... 307/65; 307/70
(58) Field of Classification Search ............... 307/65, 307/70
See application file for complete search history.

(56) References Cited

U.S. PATENT DOCUMENTS

| | | | |
|---|---|---|---|
| 5,270,896 A * | 12/1993 | McDonald | 361/45 |
| 5,648,731 A | 7/1997 | Decker et al. | |
| 6,282,104 B1 | 8/2001 | Kern | |
| 6,291,764 B1 | 9/2001 | Ishida et al. | |
| 6,339,538 B1 | 1/2002 | Handleman | |
| 6,487,457 B1 | 11/2002 | Hull et al. | |
| 6,583,521 B1 * | 6/2003 | Lagod et al. | 307/70 |

\* cited by examiner

*Primary Examiner*—Robert L. Deberadinis
(74) *Attorney, Agent, or Firm*—Burr & Brown

(57) ABSTRACT

There are provided monitors which sense a magnitude of power (and/or energy) being consumed by a facility and which sense a magnitude of power (and/or energy) being produced by at least one energy-producing system. There are provided facilities comprising at least one main panel bus, at least one external power line, at least one energy-producing system, at least one critical load sub-panel bus and at least one monitor which senses a magnitude of power (and/or energy) being consumed by the facility and a magnitude of power (and/or energy) being produced by the at least one energy-producing system. There are provided methods of monitoring power (and/or energy) consumed and power (and/or energy) produced in a facility, and devices which display magnitude of power (and/or energy) being consumed and magnitude of power (and/or energy) being produced in a battery.

19 Claims, 7 Drawing Sheets

POWER AND/OR ENERGY MONITOR, METHOD OF USING, AND DISPLAY DEVICE

CROSS REFERENCE TO RELATED APPLICATION

This application is a continuation of PCT Application No. PCT/US02/25876 filed Aug. 13, 2002 and claims the benefit of U.S. Provisional Application 60/311,881, filed Aug. 13, 2001, the entireties of which are incorporated herein by reference.

FIELD OF THE INVENTION

The present invention is directed to an apparatus for monitoring power and/or energy being consumed by a site facility (e.g., a home or other premises) which is electrically connected to one or more external power sources (e.g., a power grid), and simultaneously monitoring power and/or energy being produced by one or more energy-producing systems located within the site facility. The present invention is further directed to a method for carrying out such monitoring.

In one aspect, the present invention relates to an apparatus which simultaneously senses (1) the magnitude of power (and/or the quantity of energy over time) being consumed by a site facility, e.g, a grid-connected site facility, which includes one or more energy-producing systems (e.g., a solar-electric system) as well as (2) the magnitude of power (and/or the quantity of energy over time) being produced by the (or each) energy-producing system.

In such a system, if the energy being produced within the energy-producing system(s) within the site facility is less than what is being consumed by the site facility, energy is supplied to the site facility from one or more external power sources. In one aspect of the invention, if the energy being produced by the energy-producing system(s) within the site facility is greater than what is being consumed by the site facility, energy is supplied from the site facility to one or more external power sources.

In a specific application of the present invention, an apparatus is provided which simultaneously monitors (1) power being produced by one or more solar-electric systems, such power being supplied to a home and/or to a power grid, and (2) power being consumed by the home, i.e., power being supplied to the home by the solar-electric system(s) and/or by the power grid. In another application, there is provided an apparatus which simultaneously monitors (1) energy produced by one or more solar-electric systems over time and (2) energy consumed by a home over time. There is further provided an apparatus which simultaneously monitors (1) power being produced by one or more solar-electric systems, (2) power being consumed by a home, (3) energy produced by the solar-electric system(s) over time, and (4) energy consumed by the home over time. In a preferred aspect of the present invention, there is provided apparatus by which such monitoring is performed entirely in an analog mode, i.e., without use of a microprocessor or any other processor. Also, there are provided methods of performing any of the monitoring described above. There are also provided display devices which display the magnitude of power being consumed by the site facility, the magnitude of power being produced by one or more energy-producing system, the energy consumed by the site facility over a period of time and/or the energy produced by one or more energy-producing system over time.

BACKGROUND OF THE INVENTION

Solar-electric systems have become more and more common, and of greater and greater importance. The use of solar-electric systems is expected to increase, potentially dramatically.

Energy from solar-electric systems designed for on-site usage (e.g., residential systems) can exceed energy usage and such energy can be supplied to an external power source, e.g., a power grid. However, in many systems, at least part of the time (e.g., at night), energy from such solar-electric systems needs to be supplemented, e.g., by energy from a power grid.

In situations where a power load is supplied to a site facility from more than one source (e.g., from one or more solar-electric systems and from one or more external power source), it would be of great value to have a simple way of sensing the total magnitude of power being consumed by the site facility, the total quantity of energy consumed by the site facility over time intervals, the instantaneous level of power being produced by the (or each) energy-producing system, and the quantity of energy produced by the (or each) energy-producing system over time intervals.

In cases where a grid-connected site facility (e.g., a home or other premises) is supplied with energy from one or more energy-producing systems, such as a solar-electric system, there is a need for a simple way of sensing the total amount of power and energy being consumed by the site facility (i.e., the total consumed, whether supplied from an energy-producing system, from the power grid, or any combination thereof) as well as the amount of power and energy being produced by the (or each) energy-producing system (whether the energy produced is supplied to a circuit within the site facility, to an external power source, or to any combination thereof).

In addition, there is a need to be able to determine when an energy-producing system is not functioning properly, i.e., when it is producing less energy than it should be producing under prevailing conditions.

SUMMARY OF THE INVENTION

The present invention is directed to a simple, accurate and cost effective apparatus for monitoring power and/or energy being consumed by a site facility and power and/or energy being produced by one or more energy-producing systems located within the site facility.

The present invention is directed to an apparatus and method for providing a reading of the magnitude of power and/or energy passing through a plurality of power lines.

In one aspect, the site facility comprises at least one main panel bus, one or more main panel circuits each electrically connected to a main panel bus, at least one critical load sub-panel bus, one or more sub-panel circuits each electrically connected to a critical load sub-panel bus, and at least one energy-producing system. The (or each) main panel bus is electrically connected to one or more external power lines which each provide electrical connection between the site facility and an external power source (e.g., a power grid). Energy produced by the (or each) energy-producing system is supplied to at least one energy-producing system bus which is (or each of which is) electrically connected, by internal power lines, to at least one main panel bus and to at least one critical load sub-panel bus. Such a site facility may optionally further comprise one or more energy storage devices.

In such a site facility, energy can be supplied to the (or each) critical load sub-panel bus from an external power source (e.g., a power grid), and/or from one or more energy-producing systems within the site facility. Energy which is supplied to a critical load sub-panel bus by an external power source passes from the external power source to a main panel bus through an external power line, then from the main panel bus to an energy-producing system bus on an internal power line, and then from the energy-producing system bus to the critical load sub-panel bus through an internal power line.

By providing a site facility as described above, in the event that service from an external power source is interrupted, power can continue to be supplied to one or more critical load sub-panel bus by the energy-producing system(s). In order to provide such continued power supply, electrical connection can readily be temporarily cut off between the energy-producing system(s) and the main panel bus(es) (e.g., by flipping a switch) to which that external power source is otherwise electrically connected, thus temporarily cutting off electrical connection between the energy-producing system(s) and the external power source whose service has been interrupted, while allowing energy to be supplied to the critical load sub-panel bus(es) by the energy-producing system(s).

In accordance with the present invention, there is further provided a power and/or energy sensing apparatus which includes a first sensor which senses the magnitude of power being consumed by the site facility, and a second sensor which senses the magnitude of power being produced by the energy-producing system (or systems).

In order to sense the magnitude of power being consumed by the site facility, the first sensor senses the sum of (1) the total of all power passing from any external power source to any main panel bus through any external supply line, and (2) the total of all net power passing from any energy-producing system through any internal power line which connects an energy-producing system bus to a critical load sub-panel bus or a main panel bus.

In sensing net power, if power is passing on a first internal power line from a main panel bus to an energy-producing system bus, and simultaneously a larger magnitude of power is passing on a second internal power line from an energy-producing system bus to a critical load sub-panel bus, the net power sensed on a combination of the first and second internal power lines is the amount that the magnitude of the power passing on the second internal power line exceeds the magnitude of the power passing on the first internal power line.

In order for the first sensor to sense such sum, the first sensor includes:

for each external power line connecting an external power source to a main panel bus, a sub-sensor which senses the current flowing from the power source through that external power line to the site facility (to account for (1) the total of all power passing from any external power source to any main panel bus through any of the one or more external supply lines);

for each energy-producing system, a sub-sensor which senses the total net current passing from that energy-producing system through any internal power line connecting an energy-producing system bus of that energy-producing system to a critical load sub-panel bus or a main panel bus (to account for (2) the total of all net power passing from any energy-producing system through any internal power line which connects the energy-producing system bus to a critical load sub-panel bus or a main panel bus); and a sensor which senses the voltage in all such lines (the voltage in all such lines is the same, except that in some such lines, the voltage can be 180 degrees out of phase with respect to the voltage in other such lines).

Preferably, according to the present invention, for each energy-producing system, the sub-sensor assigned to that energy-producing system to sense the current passing through any internal line connecting that energy-producing system bus to a critical load sub-panel bus or a main panel bus is simplified by being positioned at a location where all such internal power lines connected to that energy-producing system bus are close together, e.g. where such lines are bunched together.

For each energy-producing system, in order to sense the magnitude of power being produced by that energy-producing system, the second sensor senses the sum of the total of all net power passing from any energy-producing system through any internal power line which connects an energy-producing system bus for that energy-producing system to a critical load sub-panel bus or a main panel bus. In order for the second sensor to sense such sum, the second sensor includes:

for each energy-producing system, a sub-sensor which senses the total net current passing from that energy-producing system through any internal power line connecting an energy-producing system bus of that energy-producing system to a critical load sub-panel bus or a main panel bus; and the sensor (discussed above) which senses the voltage in all such lines.

That is, the second sensor is similar to the sub-sensor(s) of the fist sensor which senses the total of all net power passing from any energy-producing system bus through any internal power line to a critical load sub-panel bus or a main panel bus. Accordingly, the second sensor can be similar to (or identical to) that (or those) sub-sensor(s) of the first sensor, and can be positioned similarly to the positioning of that (or those) sub-sensor(s).

In a specific example of a system according to the present invention, a site facility has:

a first main panel bus, a second main panel bus and a plurality of main panel circuits, each main panel circuit being selectively electrically connected (e.g., through a circuit breaker or a fuse) to one of the main panel buses;

a first external power line and a second external power line, each external power line connecting one of the main panel buses to a power grid;

a single energy-producing system (e.g., a solar-electric system) having an energy-producing system bus;

a single critical load sub-panel bus and a plurality of sub-panel circuits, each sub-panel circuit being selectively electrically connected (e.g., through a circuit breaker or a fuse) to the critical load sub-panel bus;

a first internal power line electrically connecting one of the main panel buses to the energy-producing system bus; and a second internal power line electrically connecting the energy-producing system bus to the critical load sub-panel bus.

In such a system, the first sensor senses the sum of (1) the power passing from the power grid to the first main panel bus through one of the external power lines, (2) the power passing from the power grid to the second main panel bus through the other external power line, and (3) the net power passing from the energy-producing system through a combination of the first internal power line and the second internal power line.

In this example, in order for the first sensor to achieve such sensing, there are provided a first sub-sensor on the first external power line, a second sub-sensor on the second external power line, and a third sub-sensor on both the first internal power line and the second internal power line. In accordance with a preferred aspect of the present invention, the first and second internal power lines are arranged such that the third sub-sensor can be positioned at a location where the first and second internal power lines are very close together, e.g., bunched together.

In such a system, the second sensor senses the net power passing from the energy-producing system through a combination of the first internal power line and the second internal power line. That is, the second sensor senses the same thing that is sensed by the third sub-sensor of the first sensor (described in the previous paragraph). Accordingly, the second sensor can be similar to (or identical to) the third sub-sensor of the first sensor, and can be positioned in a way which is similar to the positioning of that sub-sensor.

The present invention is by no means limited to such a system, i.e., the present invention is by no means limited to a system having exactly two main panel buses, or to a system having a plurality of main panel circuits, or to a system having exactly two external power lines, or to a system wherein the external power source is a power grid, or to a system having a single energy-producing system, or to a system having a single energy-producing system bus, or to a system having a single critical load sub-panel bus, or to a system having a plurality of sub-panel circuits, or to a system having a single internal power line electrically connecting a main panel bus to an energy-producing system bus, or to a system having a single internal power line electrically connecting an energy-producing system bus to a critical load sub-panel bus. Rather, the present invention encompasses systems which include one or more main panel buses (each having one or more main panel circuits) one or more external power sources (each connected to one or more power lines) each of which may or may not be a power grid, one or more energy-producing systems (each of which can have one or more energy-producing system buses), one or more critical load sub-panel buses (each having one or more sub-panel circuits), one or more internal power lines electrically connecting any main panel bus to any energy-producing system bus, and/or one or more internal power lines electrically connecting any energy-producing system bus to any critical load sub-panel bus.

In addition, where two or more energy-producing systems are included, the present invention is not limited to a system in which the second sensor senses the aggregate energy and/or power produced by all such energy-producing systems. That is, the present invention encompasses systems in which alternatively or additionally, the energy and/or power produced by each energy-producing system (and/or any combinations of such energy-producing systems) is/are sensed.

Any kind of current sensors and voltage sensors can be used according to the present invention, and those of skill in the art are readily familiar with sensors for sensing the magnitude (and direction) of current and voltage passing along a power line. For example, one well known device for use in sensing the magnitude of current passing along a power line is a transformer.

In accordance with a preferred aspect of the present invention, in any of the systems as described above, a transformer is positioned around each external power line which connects a main panel bus with an external power source (i.e., each external power line has its own individual transformer). In addition, for each energy-producing system bus, two transformers are each positioned around all internal power lines which connect that energy-producing system bus to (1) any main panel bus or (2) any critical load sub-panel bus, to sense net combined current flowing through such power lines. Preferably, each transformer produces a voltage signal, (preferably a low-voltage signal, e.g., a millivolt signal) having a voltage which is proportional to the sensed current or net current on the power line or power lines around which that transformer is positioned. Preferably, the signals produced by each transformer are substantially in phase with the current sensed by that transformer.

In accordance with a further preferred aspect of the present invention, there is provided at least one transducer which converts sensed information into a first signal which has a magnitude (e.g., frequency of pulses) which is proportional to the power being consumed by the site facility and a second signal which has a magnitude which is proportional to the power being produced by one or more energy-producing systems. In such a system, more than one transducer can be employed in place of a single transducer as described above, e.g., one transducer can be employed for the first signal and a second transducer can be employed for the second signal. In addition, where two or more energy-producing systems are included in the site facility, there can be separate signals proportional to the power being produced by each energy-producing system and/or combinations of two or more energy-producing systems, and such signals can be produced in any combinations within one or more transducers.

In a preferred aspect of the present invention, there is provided apparatus which includes transformers as described above, at least one line voltage line which carries a voltage which is indicative of the voltage in the power lines, and a transducer which uses the signals from the transformers and the at least one line voltage line to generate a first signal which is representative of the magnitude of power (and/or energy) being consumed by the site facility a second signal which is representative of the magnitude of power (and/or energy) being produced by the one or more energy-producing systems in entirely an analog mode, i.e., without a microprocessor or any other processor.

In accordance with a further preferred aspect of the present invention, there are provided one or more display devices which display the magnitude of power being consumed by the site facility, the magnitude of power being produced by one or more energy-producing system, the energy consumed by the site facility over a period of time and/or the energy produced by one or more energy-producing system over time. In addition, where two or more energy-producing systems are included in the site facility, there can be separate displays for each of the energy-producing systems and/or combinations of two or more energy-producing systems.

In a preferred aspect of the present invention, the one or more display devices convert a first signal generated by a transducer into a display of the power being consumed by the site facility, and convert a second signal generated by that transducer or another transducer into a display of the power being produced by one or more energy-producing systems.

In another preferred aspect of the present invention, one or more signals generated by a transducer are series of electronic pulses, and the display device provides one or more displays which are indicative of the frequency of such pulses. Preferably, a first signal generated by the one or more transducer is a series of electronic pulses, the frequency of which is proportional to the magnitude of the power being consumed by the site facility; and a second signal generated by the one or more transducer is a series of electronic pulses, the frequency of which is proportional to the magnitude of the power being produced by one or more energy-producing system. In this aspect of the invention, a display device generates a display of the power being consumed by the site facility based on the frequency of the pulses of the first signal, and a display device (preferably the same display device) generates a display of the power being produced by the one or more energy-producing systems based on the frequency of the pulses of the second signal. In such an embodiment, the total number of pulses of the first signal over a given time span will therefore be proportional to the total quantity of energy consumed by the site facility over that time span, and, similarly, the total number of pulses of the second signal over a given time span will be proportional to the total quantity of energy produced by the one or more energy-producing systems over that time span. Accordingly, the display device can additionally (or alternatively) generate a display of the energy consumed by the site facility over a particular time span and/or generate a display of the energy produced by the one or more energy-producing systems over a particular time span.

The present invention further provides monitors in which at least first and second power lines are connected to respective at least first and second main panel buses and at least one of the main panel buses is connected to at least one energy-producing system bus (and there is no critical load sub-panel).

The present invention further provides monitors in which at least first and second power lines are connected to respective at least first and second main panel buses, and each of the first and second main panel buses is connected to a single energy-producing system (and there is no critical load sub-panel).

BRIEF DESCRIPTION OF THE DRAWINGS FIGURES

DETAILED DESCRIPTION OF THE INVENTION

As noted above, the present invention is directed to a simple, accurate and cost effective apparatus for monitoring power and/or energy being consumed by a site facility and power and/or energy being produced by one or more energy-producing systems located within the site facility.

The site facility comprises at least one main panel bus, one or more main panel circuits each electrically connected to a main panel bus, at least one critical load sub-panel bus, one or more sub-panel circuits each electrically connected to a critical load sub-panel bus, and at least one energy-producing system. The (or each) main panel bus is electrically connected to one or more external power lines which each feed power to the site facility from an external power source (e.g., a power grid). Energy produced by the (or each) energy-producing system is supplied to at least one energy-producing system bus which is (or each of which is) electrically connected to at least one main panel bus and to at least one critical load sub-panel bus. Such a site facility may optionally further comprise one or more energy storage devices.

Each main panel circuit is selectively electrically connected (e.g., through a circuit breaker or a fuse) to a main panel bus, and each sub-panel circuit is selectively electrically connected (e.g., through a circuit breaker or a fuse) to a critical load sub-panel bus.

Figure 1:
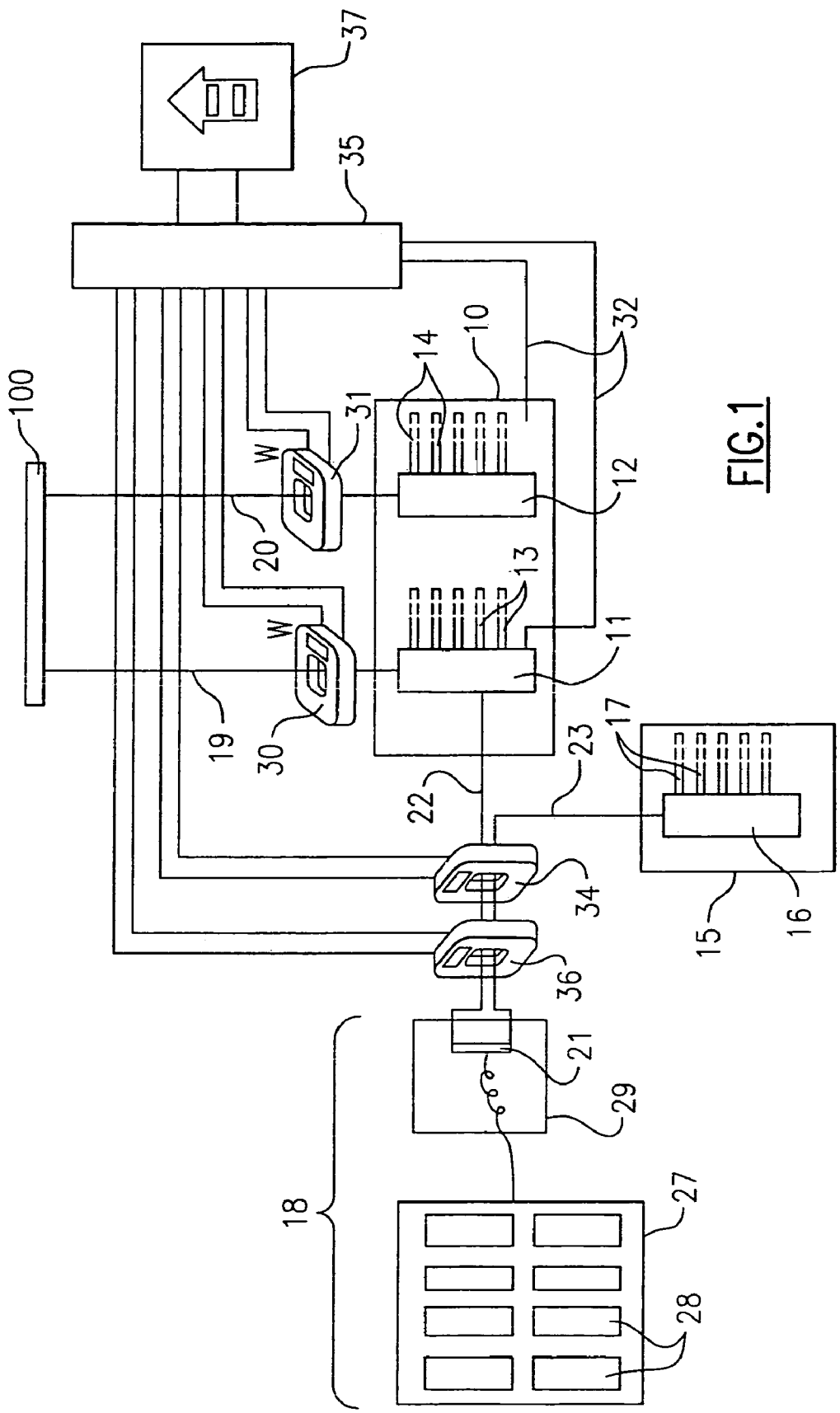
FIG. 1 is a schematic representation of a first preferred embodiment of the present invention.

A first preferred embodiment of the present invention is depicted in FIG. 1. In the embodiment depicted in FIG. 1, a site facility includes a main panel 10 having a first main panel bus 11 and a second main panel bus 12, a plurality of first main panel circuits 13 each selectively electrically connected through a circuit breaker to the first main panel bus 11, a plurality of second main panel circuits 14 each selectively electrically connected through a circuit breaker to the second main panel bus 12, a critical load sub-panel 15, a critical load sub-panel bus 16, a plurality of sub-panel circuits 17 each selectively electrically connected through a circuit breaker to the critical load sub-panel bus 16, and an energy-producing system 18. The first main panel bus 111 is electrically connected to a power grid 100 through a first external power line 19. The second main panel bus 12 is electrically connected to the power grid 100 through a second external power line 20.

In the first preferred embodiment, energy produced by the energy-producing system 18 is supplied to an energy-producing system bus 21. The energy-producing system bus 21 is electrically connected to the first main panel bus 11 through a first internal power line 22, and the energy-producing system bus 21 is electrically connected to the critical load sub-panel bus 16 through a second internal power line 23.

In the first preferred embodiment, the energy-producing system 18 is a solar-electric system which includes a photovoltaic array 27 (including a plurality of photovoltaic cells 28) which produces DC power, and an inverter 29 which converts the DC power produced by the photovoltaic array 27 into AC power which is output to the energy-producing system bus 21, the AC power having a voltage which is equal to (or substantially equal to) the voltage on the power lines 19, 20, 22 and 23, and which is in phase with the voltage on the power lines 19, 22 and 23 (as described below, in this embodiment, the voltage on the power line 20 is 180 degrees out of phase with the voltage on the power lines 19, 22 and 23). Such solar-electric systems are well known and further description is not needed.

As mentioned above, in accordance with the present invention, the first sensor senses the magnitude of power being consumed by the site facility, and the second sensor senses the magnitude of power being produced by the energy-producing system(s).

In order to sense the magnitude of power being consumed by the site facility, the first sensor senses the sum of (1) the total of all power passing from any external power source to any main panel bus through any external supply line, and (2) the total of all net power passing from any energy-producing system through any internal power line which connects the energy-producing system bus to a critical load sub-panel bus, or a main panel bus.

In a system as described above, all power being transmitted falls into one of the following groups:

power which is being transmitted from an energy-producing system to an external power source;

power which is being transmitted from an energy-producing system to a sub-panel circuit;

power which is being transmitted from an energy-producing system to a main panel circuit;

power which is being transmitted from an external power source to a sub-panel circuit; and power which is being transmitted from an external power source to a main panel circuit.

With the apparatus of the present invention, the first sensor senses the magnitude of power being consumed by the site facility, because:

Any power which is being sent from an energy-producing system to an external power source must pass from the energy-producing system bus to a main panel bus, and from the main panel bus to the external power source. The magnitude of such power is accordingly added to the sum as the power passes from the energy-producing system bus to the main panel bus. The magnitude of such power is also subtracted from the sum as the power passes from the main panel bus back to the external power source. The addition and subtraction of such power magnitude thus cancel each other (such energy is not being consumed by the site facility, but is instead being sent to the external power source).

Any power which is being sent from an energy-producing system to a sub-panel circuit must pass from the energy-producing system bus to a critical load sub-panel bus, and from the critical load sub-panel bus into the sub-panel circuit. The magnitude of such power is accordingly added to the sum as the power passes from the energy-producing system to the critical load sub-panel bus (such energy is being consumed by the site facility).

Any power which is being sent from an energy-producing system to a main panel circuit must pass from the energy-producing system bus to a main panel bus, and from the main panel bus into the main panel circuit. The magnitude of such power is accordingly added to the sum as the power passes from the energy-producing system to the main panel bus (such energy is being consumed by the site facility).

Any power which is being sent from an external power source to a main panel circuit must pass from the external power source to a main panel bus, and from the main panel bus into the main panel circuit. The magnitude of such power is accordingly added to the sum as the power passes from the external power source to the main panel bus (such energy is being consumed by the site facility).

Any power which is being sent from an external power source to a sub-panel circuit must pass from the external power source to a main panel bus, and then from the main panel bus to an energy-producing system bus, and then from the energy-producing system bus to a critical load sub-panel bus, and then from the critical load sub-panel bus into the sub-panel circuit. The magnitude of such power is accordingly added to the sum as the power passes from the external power source to the main panel bus. The magnitude of such power is also subtracted from the sum as the power passes from the main panel bus to the energy-producing system bus. The magnitude of such power is also again added to the sum as the power passes from the energy-producing system bus to the critical load sub-panel bus. Thus, the subtraction and one of the additions of the power magnitude cancel each other, leaving an addition to the sum (such energy is being consumed by the site facility) equal to the magnitude of the power passing from the external power source to the main panel bus.

As a result, the magnitude of power sensed by the first sensor will be equal to the sum of: (1) the magnitude of any power which is being sent from an external power source to a main panel circuit, plus (2) the magnitude of any power which is being sent from an external power source to a sub-panel circuit, plus (3) the magnitude of any power which is being sent from an energy-producing system to a sub-panel circuit, plus (4) the magnitude of any power which is being sent from an energy-producing system to a main panel circuit.

Accordingly, the first sensor senses the sum of the power passing from any external power source to any main panel bus through an external supply line, and the net power passing through a combination of all power lines which connect an energy-producing system bus to a critical load sub-panel bus or a main panel bus. In sensing this sum, if power is passing from an external power source to a main panel bus, the magnitude of such power is added to the sum; if power is passing from a main panel bus to an external power source (e.g., the site facility is supplying power back to the power grid), the magnitude of such power is subtracted from the sum. Likewise, if power is passing from an energy-producing system bus to a critical load sub-panel bus, the magnitude of such power is added to the sum; if power is passing from an energy-producing system bus to a main panel bus, the magnitude of such power is added to the sum; if power is passing from a main panel bus to an energy-producing system bus, the magnitude of such power is subtracted from the sum.

In accordance with a preferred aspect of the present invention, in any of the systems as described above, a transformer is positioned around each external power line which connects a main panel bus with an external power source (i.e., each external power line has its own individual transformer). In addition, for each energy-producing system bus, two transformers are each positioned around all internal power lines which connect that energy-producing system bus to (1) any main panel bus, or (2) any critical load sub-panel bus, to sense net combined current flowing through such power lines. Each transformer preferably produces a low-voltage signal (e.g., less than about one volt) having a voltage which is proportional to the sensed current or net current on the power line or power lines around which that transformer is positioned, and said low-voltage signals are in phase with the current being sensed by that transformer.

At least one voltage sensor is provided to produce a line voltage signal which is representative of the voltage on all the power lines in the system, and that voltage signal is carried on a line voltage line.

In the first preferred embodiment shown in FIG. 1, a first transformer 30 is positioned around the first external power line 19 (oriented with the power grid as the source) and a second transformer 31 is positioned around the second external power line 20 (as discussed below, oriented with the second main panel bus 12 as the source). As is conventional in supplying power from a power grid to a home, in this embodiment, the respective AC currents flowing through the first external power line 19 and the second external power line 20 are 180 degrees out of phase.

The first transformer 30 generates a first current signal having a voltage (preferably a low voltage, e.g., a millivolt voltage) which is proportional to the magnitude of current flowing through the first external power line 19, the first current signal being substantially in phase with the current flowing through the first external power line 19. The second transformer 31 generates a second current signal having a voltage (preferably a low voltage, e.g., a millivolt voltage) which is proportional to the magnitude of current flowing through the second external power line 20.

In the first preferred embodiment shown in FIG. 1, there is further provided a line voltage line 32 which carries a line voltage signal having a voltage which is representative of the voltage of the current on the first external power line 19, the first internal power line 22, the second internal power line 23, and (except for being 180 degrees out of phase) the second external power line 20.

In addition, in the first preferred embodiment depicted in FIG. 1, the first sensor further includes a third transformer 34 which is positioned around the first internal power line 22 and the second internal power line 23, and is oriented with the energy-producing system bus 21 as the source.

Thus, the third transformer 34 generates a third current signal having a voltage (preferably a low voltage, e.g., a millivolt voltage) which is proportional to the magnitude of the net current flowing through a combination of the first internal power line 22 and the second internal power line 23, the third current signal being substantially in phase with the net current flowing through a combination of the first internal power line 22 and the second internal power line 23.

Consistent with the discussion above, by "net current" is meant that if current is flowing from the first main panel bus 11 to the energy-producing system bus 21 on the first internal power line 22 (i.e., to the left as shown in FIG. 1), and a current of equal magnitude is flowing from the energy-producing system bus 21 to the critical load sub-panel bus 16 on the second internal power line 23 (i.e., to the right as shown in FIG. 1), the net current is zero. If current is flowing from the first main panel bus 11 to the energy-producing system bus 21 on the first internal power line 22, and a larger current is flowing from the energy-producing system bus 21 to the critical load sub-panel bus 16 on the second internal power line 23, the net current equals the current flowing from the energy-producing system bus 21 to the critical load sub-panel bus 16 minus the current flowing from the first main panel bus 11 to the energy-producing system bus 21. If current is flowing from the energy-producing system bus 21 to the critical load sub-panel bus 16 and no current is flowing between the first main panel bus 11 and the energy-producing system bus 21, the net current equals the current flowing from the energy-producing system bus 21 to the critical load sub-panel bus 16. If current is flowing from the energy-producing system bus 21 to the critical load sub-panel bus 16 and current is flowing from the energy-producing system bus 21 to the first main panel bus 11, the net current equals the sum of the currents.

The third transformer 34 inherently senses the net current because the magnetic field generated by current flowing from left to right through the transformer is canceled by the magnetic field generated by equal current flowing from right to left through the transformer; where current flowing in one direction through the transformer exceeds current flowing in the opposite direction through the transformer, the magnetic field generated by the smaller current will cancel a proportionate amount of the magnetic field generated by the larger current, i.e., the net result will be the same as if only a single current were flowing through the transformer, in the direction of the larger current, with a magnitude equal to the amount that the larger current exceeds the smaller current; and where current flows in the same direction through the transformer on two or more power lines, the magnetic field generated will be the same as if current of a magnitude equal to the sum of the respective currents were flowing on a single power line through the transformer in that same direction.

In the first preferred embodiment shown in FIG. 1, there is further provided a transducer 35. The transducer 35 includes circuitry by which the phase of the second current signal from the second transformer 31 is shifted in phase by about 180 degrees (preferably, merely by wiring the second transformer 31 backward, so that as discussed above, it is oriented with the second main panel bus 12 as the source). As mentioned above, the voltage in the second external power line 20 is about 180 degrees out of phase with the voltage in the first external power line 19, the first internal power line 22 and the second internal power line 23. In the transducer 35, the first transformer 30, the 180 degree phase-shifted second transformer 31 and the third transformer 34 are substantially in phase, and are connected in series, such that a combined voltage drop across the first transformer 30, the second transformer 31 and the third transformer 34 equals the sum of the first current signal, the second current signal and the third current signal, the combined voltage drop thus being representative of the combined current (and phase) through each of the respective power lines sensed by the first sensor. The line voltage line 32 is also connected to the transducer 35, thus providing a signal which is representative of the voltage (and its phase) in each of the power lines 19, 20 (180 degrees out of phase), 22 and 23.

Power is equal to:

current·voltage·power factor power factor being based on the relationship between the phase of the voltage and the phase of the current. Accordingly, the transducer (which is calibrated, e.g., by varying the line voltage) is supplied with all the information necessary to generate a signal which is representative of the power being consumed by the site facility. A number of power measurement devices suitable for use in such transducers are known in the art, one example being the AD7755 power measurement integrated circuit sold by Analog Devices.

Based on the information sensed, the transducer 35 generates a first signal which has a magnitude which is proportional to the power being consumed by the site facility. The first signal in this embodiment is a series of pulses, the frequency of which is proportional to the magnitude of the power being consumed by the site facility (and therefore, the total number of pulses in a time span is proportional to the energy consumed over that time span).

In order to sense the magnitude of power being produced by the energy-producing system(s), the second sensor senses the net power passing through a combination of all power lines which connect an energy-producing system bus to a critical load sub-panel bus or a main panel bus.

In sensing this sum, if power is passing from an energy-producing system bus to a critical load sub-panel bus, the magnitude of such power is added to the sum; if power is passing from an energy-producing system bus to a main panel bus, the magnitude of such power is added to the sum;

if power is passing from a main panel bus to an energy-producing system bus, the magnitude of such power is subtracted from the sum.

That is, the second sensor is similar to the sub-sensor for the first sensor which senses the same total. Accordingly, the second sensor can be similar to (or identical to) the sub-sensor for the first sensor which senses the net power passing from an energy-producing system bus to a critical load sub-panel bus or a main panel bus, and can be positioned similarly to the positioning of that sub-sensor. Accordingly, in a preferred embodiment according to the present invention, the second sensor is simplified by being positioned at a location where (1) the (or each) internal power line connecting the energy-producing system bus to a critical load sub-panel bus, and (2) the (or each) internal power line connecting the energy-producing system bus to a main panel bus are close to each other, e.g. where such lines are bunched together.

Accordingly, as explained above with respect to the first sensor, in sensing a net power magnitude, if power is passing on a first internal power line from a main panel bus to an energy-producing system bus, and simultaneously a larger magnitude of power is passing on a second internal power line from an energy-producing system bus to a critical load sub-panel bus, the net power sensed on a combination of the first and second internal power lines is the amount that the magnitude of the power passing on the second line exceeds the magnitude of the power passing on the first line.

With the apparatus of the present invention, the second sensor senses the magnitude of power being produced by the energy-producing system(s), because:

Any power which is being sent from an energy-producing system to an external power source must pass from the energy-producing system bus to a main panel bus, and from the main panel bus to the external power source. The magnitude of such power is accordingly added to the sum as the power passes from the energy-producing system bus to the main panel bus (such energy is being produced by the energy-producing system(s)).

Any power which is being sent from an energy-producing system to a sub-panel circuit must pass from the energy-producing system bus to a critical load sub-panel bus, and from the critical load sub-panel bus into the sub-panel circuit. The magnitude of such power is accordingly added to the sum as the power passes from the energy-producing system bus to the critical load sub-panel bus (such energy is being produced by the energy-producing system(s)).

Any power which is being sent from an energy-producing system to a main panel circuit must pass from the energy-producing system bus to a main panel bus, and from the main panel bus into the main panel circuit. The magnitude of such power is accordingly added to the sum as the power passes from the energy-producing system bus to the main panel bus (such energy is being produced by the energy-producing system(s)).

Any power which is being sent from an external power source to a main panel circuit must pass from the external power source to a main panel bus, and from the main panel bus into the main panel circuit. Such power accordingly is not sensed by the second sensor (such energy is being supplied by the external source).

Any power which is being sent from an external power source to a sub-panel circuit must pass from the external power source to a main panel bus, and then from the main panel bus to an energy-producing system bus, and then from the energy-producing system bus to a critical load sub-panel bus, and then from the critical load sub-panel bus into the sub-panel circuit. The second sensor does not sense such power as the power passes from the external power source to the main panel bus. The magnitude of such power is subtracted from the sum as the power passes from the main panel bus to the energy-producing system bus. The magnitude of such power is also added to the sum as the power passes from the energy-producing system bus to the critical load sub-panel bus. The subtraction and the addition of the power magnitude cancel each other (such energy is being supplied by the external source).

Preferably, any power needed to operate the transducer 35 is supplied by the line voltage line 32.

In the first preferred embodiment depicted in FIG. 1, there is provided a fourth transformer 36 which is positioned, like the third transformer 34, around the first internal power line 22 and the second internal power line 23, and, like the third transformer 34, is oriented with the energy-producing system bus 21 as the source.

Thus, the fourth transformer 36 generates a fourth current signal having a voltage (preferably a low voltage, e.g., a millivolt voltage) which, like the third current signal, is proportional to the magnitude of the net current flowing through a combination of the first internal power line 22 and the second internal power line 23. The fourth current signal, like the third current signal, is substantially in phase with the net current flowing through a combination of the first internal power line 22 and the second internal power line 23. According to this embodiment, the fourth current signal is fed to the transducer 35.

In accordance with this embodiment, the voltage, phase of the voltage and the phase of the current are substantially the same as in each power line sensed by the first sensor (i.e, the first external power line 19, the 180 degree phase-shifted second external power line 20, the first internal power line 22 and the second internal power line 23). Alternatively, there could be a second line voltage signal (which would be similar to the first line voltage signal) supplied to the transducer for generating the second signal.

Accordingly, based on the fourth current signal and the line voltage signal, the transducer 35 generates a second signal which has a magnitude which is proportional to the power being produced by the energy-producing system 18. The second signal in this embodiment, like the first signal, is a series of pulses, the frequency of which is proportional to the magnitude of the power being produced by the energy-producing system (and therefore, the total number of pulses in a time span is proportional to the energy produced over that time span).

As noted above, in accordance with a further preferred aspect of the present invention, there are provided one or more display devices which display the magnitude of power being consumed by the site facility, the magnitude of power being produced by one or more energy-producing system, the energy consumed by the site facility over a period of time and/or the energy produced by one or more energy-producing system over a period of time.

Figure 2:
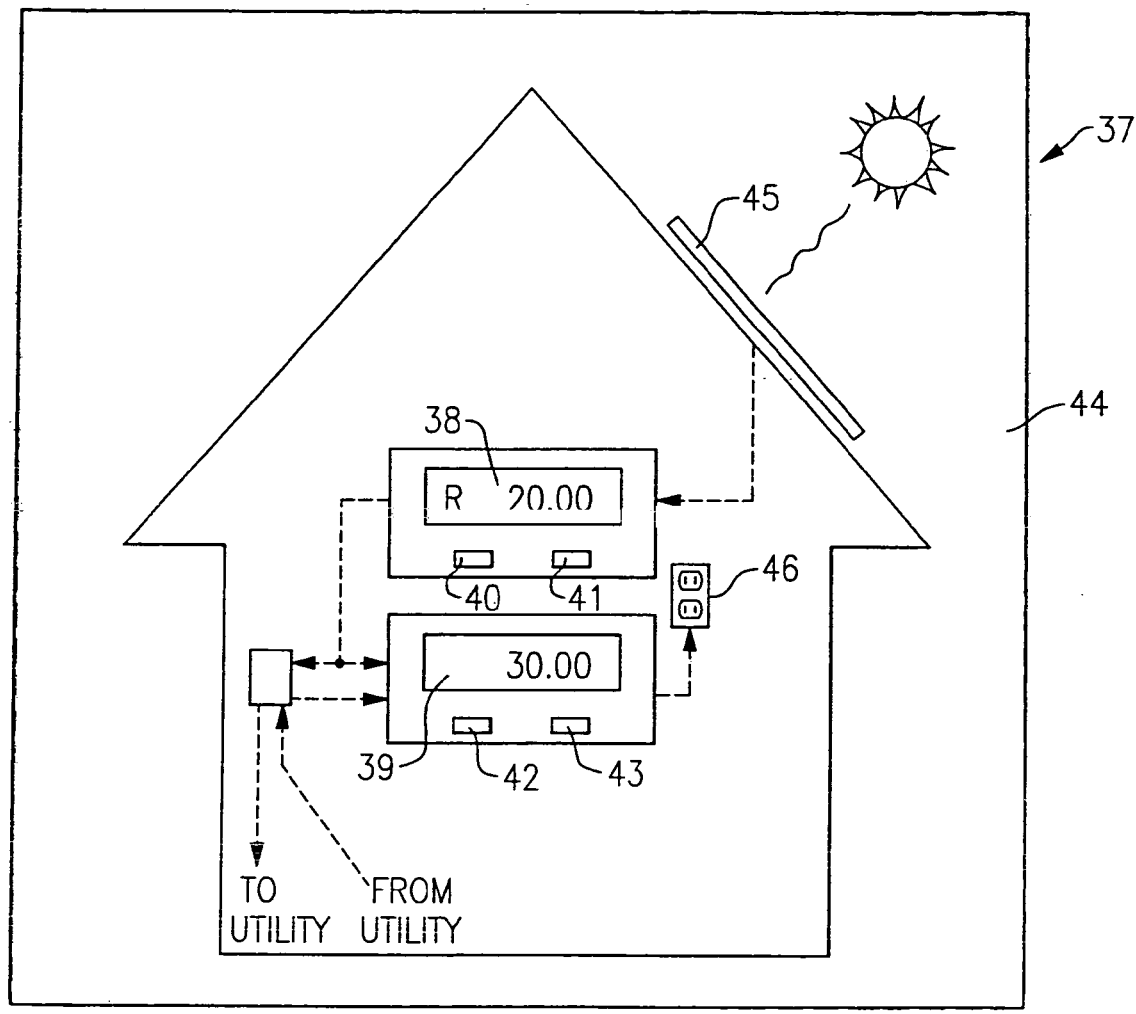
FIG. 2 depicts a display device according to the first embodiment.

In the first preferred embodiment depicted in FIG. 1, there is further provided a display device 37. FIG. 2 depicts the display device 37 in more detail. As shown in FIG. 2, the display device 37 has a solar-electric system production display area 38 and a site facility consumption display area 39.

By routine calibration, the pulse signals can readily be converted into digital readings of magnitude of power and/or cumulative energy over time.

The display device 37 of this embodiment includes a solar-electric system power/energy production switch 40 which, when pressed, toggles the display device 37 between (1) a setting where the solar-electric system production display area 38 includes a display of the instantaneous magnitude of the power being produced by the solar-electric system, and (2) a setting where the solar-electric system production display area 38 includes a display of the quantity of energy produced by the solar-electric system since last reset. The display device 37 of this embodiment further includes a solar-electric system energy quantity reset button 41 which, when pressed, resets the energy quantity for the display area 38 to zero. The display device 37 of this embodiment further includes a mode indicator which indicates whether the display area 38 is displaying magnitude of power or quantity of energy. In this embodiment, this mode indicator is a field within the display area 38 in which the letter "R" (an abbreviation for "rate") appears when the display area 38 is displaying magnitude of power, and does not appear when the display area 38 is displaying quantity of energy.

The display device 37 of this embodiment further includes a site facility power/energy consumption switch 42 which, when pressed, toggles the display device 37 between (1) a setting where the site facility consumption display area 39 includes a display of the instantaneous magnitude of the power being consumed by the site facility, and (2) a setting where the display area 39 includes a display of the quantity of energy consumed by the site facility since last reset. The display device 37 of this embodiment further includes a site facility energy quantity reset button 43 which, when pressed, resets the energy quantity for the display area 39 to zero. The display device of this embodiment further includes a mode indicator which indicates whether the display area 39 is displaying magnitude of power or quantity of energy. In this embodiment, this mode indicator is a field within the display area 39 in which the letter "R" (an abbreviation for "rate") appears when the display area 39 is displaying magnitude of power, and does not appear when the display area 39 is displaying quantity of energy.

The display device shown in FIG. 2 further includes a mounting board 44 on which the solar-electric system production display area 38 and the site facility consumption display area 39 are mounted. In this embodiment, the mounting board schematically indicates flow of power from a solar-electric system 45 to the solar-electric system production display area 38, from the solar-electric system production display area 38 to the site facility consumption display area 39 or to an external power source ("TO UTILITY"), from the external power source ("FROM UTILITY") to the site facility consumption display area 39, and from the site facility consumption display area 39 to the power load 46 in the site facility (shown schematically as an outlet).

As noted above, the present invention is not limited to the embodiment depicted in FIG. 1, and none of the components of the present invention are limited to the components depicted in FIG. 1.

For example, the present invention is not limited to a site facility having a pair of main panel buses. Instead, the site facility could have a single main panel bus, at least one external power line electrically connecting at least one external power source to the main panel bus, and an internal power line connecting the main panel bus to at least one energy-producing system bus. Alternatively, the site facility could have three or more main panel buses, each main panel bus having at least one external power line connecting it to at least one external power source, and each main panel bus having at least one internal power line connecting it to at least one energy-producing system bus. In any such site facility, each external power line has a sub-sensor which senses the current passing through that external power line, for the first sensor (i.e., the sensor which senses the magnitude of power being consumed by the site facility). Where two or more external power lines are of the same or similar voltage and are in phase, a single sub-sensor can be used to sense the combined net power passing through those external power lines. In addition, in any such system, (1) every internal power line connecting an energy-producing system bus to a main panel bus, and (2) every internal power line connecting an energy-producing system bus to a critical load sub-panel bus, is sensed by at least two sub-sensors which sense the magnitude of power passing through that power line, one of the sub-sensors being for the first sensor and at least one other being for a second sensor (i.e., the sensor or sensors which sense the magnitude of power being produced by one or more of the energy-producing systems). For any number of internal power lines which are of the same or similar voltage and in phase, a single sub-sensor can be used to sense the combined net power passing through those internal power lines.

Each main panel circuit is preferably connected to a single external power source through a single external power line. However, it is possible for one or more main panel circuits to be connected to more than one external power source, and/or for any of the main panel circuits to be connected to each of one or more external power sources by more than one external power line.

In addition, each main panel bus can be connected to one or more energy-producing system buses through one or more internal power lines, so long as each such internal power line is sensed by at least two sub-sensors which sense the magnitude of power passing through that power line, one of the sub-sensors being for the first sensor and at least one other being for a second sensor.

As mentioned above, although it is preferred to have a single external power source, and for that external power source to be a power grid, there can be one or more external power sources, each of which can be any kind of power source, a variety of which are known to those of skill in the art.

The site facility preferably has a single energy-producing system, preferably a solar-electric system, but according to the present invention, the site facility can have more than one energy-producing system, each of which can be any kind of energy-producing system, a variety of which are known to those of skill in the art. As for the energy being produced, where more than one energy-producing system is included in the site facility, the sensor of the present invention can (1) add all the energy being produced together to generate a single energy-production value which reflects the total energy being produced, (2) generate an energy-production value for each individual energy-producing system, (3) generate one or more values reflecting the combined energy produced by any two or more energy-producing systems, or (4) any desired combination of (1), (2) and/or (3). In order to add any such energy-production values together, any of the techniques described herein for adding energy values together is employed.

In addition, where two or more energy-producing systems are included in the site facility, there can be separate displays for each of the energy-producing systems and/or combinations of two or more energy-producing systems, and/or a single display for the combined energy produced by all of the energy-producing systems in the site facility.

Although it is preferred to have a single energy-producing system having a single energy-producing system bus, any energy-producing system can have more than one energy-producing system bus, so long as for each energy-producing system bus, (1) every internal power line connecting that energy-producing system bus to a main panel bus, and (2) every internal power line connecting that energy-producing system bus to a critical load sub-panel bus, is sensed by at least two sub-sensors which sense the current passing through that power line, one of the sub-sensors being for the first sensor and at least one other being for a second sensor.

The site facility preferably has a single critical load sub-panel bus, but it can have more than one critical load sub-panel bus. Each critical load sub-panel bus is connected to one or more energy-producing system bus through one or more internal power lines, so long as each such internal power line is sensed by at least two sub-sensors which sense the current passing through that power line, one of the sub-sensors being for the first sensor and at least one other being for a second sensor.

Furthermore, although each of the one or more main panel buses preferably has a plurality of main panel circuits, any main panel bus can have only a single circuit; likewise, although each of the one or more critical load sub-panel buses preferably has a plurality of sub-panel circuits, any critical load sub-panel bus can have only a single circuit.

That is, the present invention encompasses site facilities which include one or more main panel buses each having one or more main panel circuits, one or more external power lines, one or more external power sources each of which may or may not be a power grid, one or more energy-producing systems each having one or more energy-producing system buses, one or more critical load sub-panel buses, one or more sub-panel circuits, one or more internal power lines electrically connecting any main panel bus to any energy-producing system bus, and one or more internal power lines electrically connecting any energy-producing system bus to any critical load sub-panel bus.

In addition, according to the present invention, more than one transducer can be employed in place of a single transducer as described above, e.g., one transducer can be employed for the first signal and a second transducer can be employed for the second signal.

In the first preferred embodiment depicted in FIG. 1 and described above, each transformer senses the net current being transmitted through one or more lines and generates a signal having a voltage (preferably a low voltage, e.g., a millivolt voltage) which is proportional to the magnitude of the net current flowing through such lines. Where it is necessary, in order to calculate the magnitude of power being consumed by the site facility or the magnitude of power being produced by the one or more energy-producing system, to add the magnitudes of power passing through lines being sensed by two or more such transformers, the voltages of the signals generated by such transformers are added by connecting those transformers in series. As mentioned above, any other means for sensing power passing through a line can be used. For example, if power is sensed using transformers which generate signals having current which is proportional to the magnitude of net current flowing through the one or more lines being sensed, such current values can be added, where necessary, using any suitable wiring schematic, e.g., by providing a circuit in which such transformers are connected in parallel and sensing the total current passing through such circuit.

Figure 3:
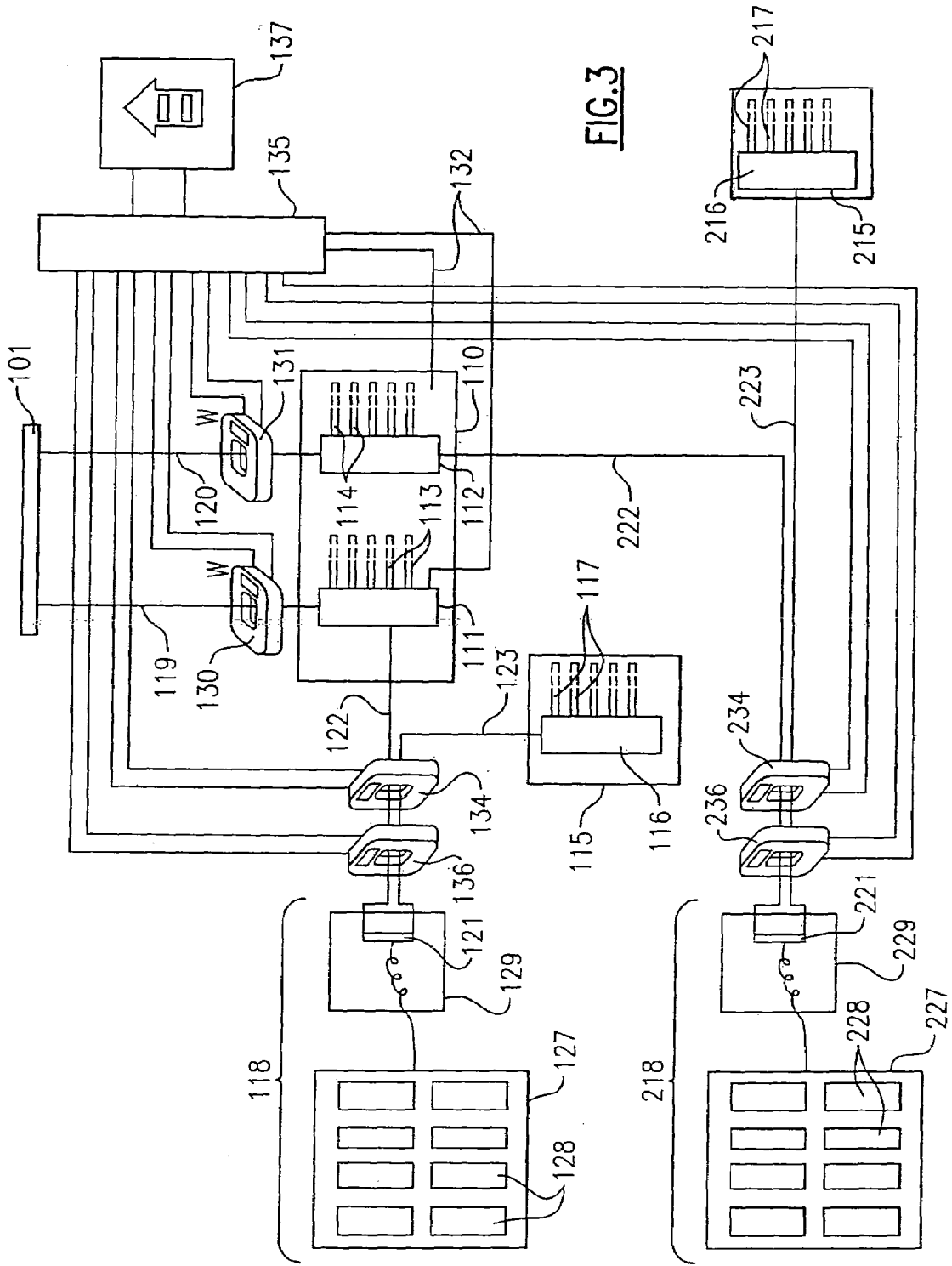
FIG. 3 is a schematic representation of a second preferred embodiment of the present invention.

A second preferred embodiment of the present invention is depicted in FIG. 3. The second preferred embodiment is similar to the first preferred embodiment, except that in the second preferred embodiment, a second energy-producing system is provided which has a second energy-producing system bus, a third internal power line is provided which electrically connects the second main panel bus to the second energy-producing system bus, a second critical load sub-panel is provided which has a plurality of second critical load circuits, a fourth internal power line is provided which electrically connects the second energy-producing system bus to the second critical load sub-panel bus, and fifth and sixth transformers are provided around both the third and fourth internal power lines.

In the second preferred embodiment, the power being produced by the second energy-producing system is in phase with the power passing through the second external power line connecting the second main panel bus to the external power source. Accordingly, the power being produced by the second energy-producing system is 180 degrees out of phase with the power being produced by the first energy-producing system. The fifth and sixth transformers are 180 degrees out of phase relative to the third and fourth transformers, i.e., the fifth and sixth transformers are wired backward into the transducer. Due to the 180 degree phase shift of the fifth and sixth transformers relative to the third and fourth transformers, the current signals produced by the fifth and sixth transformers are in phase with the current signals of the first, second, third and fourth transformers. Accordingly, the voltage signal from the fifth transformer can be added (by wiring the fifth transformer in series with the first, second and third transformers) to the voltage signals from the first, second and third transformers to provide a combined voltage drop which can be used, along with a line voltage signal, to produce the first signal (for use in generating a display of the power being consumed by the site facility). Also, if desired, the voltage signal from the sixth transformer can be added (by wiring the sixth transformer in series with the fourth transformer) to the voltage signal from the fourth transformer to provide a combined voltage drop which can be used, along with a line voltage signal, to produce the second signal (for use in generating a display of the total magnitude of power being produced by the first and second energy-producing systems). Alternatively, the voltage signal from the sixth transformer alone can be used, along with a line voltage signal, to generate a display of the power being produced by the second energy-producing system.

In the second preferred embodiment depicted in FIG. 3, a site facility includes a main panel 110 having a first main panel bus 111 and a second main panel bus 112, a plurality of first main panel circuits 113 each selectively electrically connected through a circuit breaker to the first main panel bus 111, a plurality of second main panel circuits 114 each selectively electrically connected through a circuit breaker to the second main panel bus 112, a first critical load sub-panel 115, a first critical load sub-panel bus 116, a plurality of first sub-panel circuits 117 each selectively electrically connected through a circuit breaker to the first critical load sub-panel bus 116, a second critical load sub-panel 215, a second critical load sub-panel bus 216, a plurality of second sub-panel circuits 217 each selectively electrically connected through a circuit breaker to the second critical load sub-panel bus 216, a first energy-producing system 118 and a second energy-producing system 218.

Similar to the first preferred embodiment, the first main panel bus 111 is electrically connected to a power grid 101 through a first external power line 119, and the second main panel bus 112 is electrically connected to the power grid 101 through a second external power line 120.

Energy produced by the first energy-producing system 118 is supplied to a first energy-producing system bus 121.

The first energy-producing system bus 121 is electrically connected to the first main panel bus 111 through a first internal power line 122, and the first energy-producing system bus 121 is electrically connected to the first critical load sub-panel bus 116 through a second internal power line 123. The first energy-producing system 118 is a first solar-electric system which includes a first photovoltaic array 127 (including a first plurality of photovoltaic cells 128) which produces DC power, and a first inverter 129 which converts the DC power produced by the first photovoltaic array 127 into AC power which is output to the first energy-producing system bus 121.

A first transformer 130 is positioned around the first external power line 119 and a second transformer 131 is positioned around the second external power line 120. The respective AC currents flowing through the first external power line 119 and the second external power line 120 are 180 degrees out of phase. The first transformer 130 is oriented with the power grid 101 as the source, and the second transformer 131 is oriented with the second main panel bus 112 as the source (by being wired backward in the transducer 135). A third transformer 134 and a fourth transformer 136 are each positioned around the first internal power line 122 and the second internal power line 123, and are each oriented with the first energy-producing system bus 121 as the source.

In the second preferred embodiment, the second energy-producing system 218 is a second solar-electric system. The second solar electric system includes a second photovoltaic array 227 (including a second plurality of photovoltaic cells 228) which produces DC power, and a second inverter 229 which converts the DC power produced by the second photovoltaic array 227 into AC power which is output to a second energy-producing system bus 221.

In addition, in the second preferred embodiment, there are further provided a third internal power line 222 which electrically connects the second main panel bus 112 to the second energy-producing system bus 221, a fourth internal power line 223 which electrically connects the second energy-producing system bus 221 to the second critical load sub-panel bus 216, a fifth transformer 234 provided around both the third internal power line 222 and the fourth internal power line 223, and a sixth transformer 236 also provided around both the third internal power line 222 and the fourth internal power line 223.

There is further provided a line voltage line 132 which carries a line voltage signal having a voltage which is representative of the voltage of the current on the first external power line 119, the second external power line 120 (except being 180 degrees out of phase), the first and second internal power lines 122 and 123, and the third and fourth internal power lines 222 and 223 (except being 180 degrees out of phase).

There is further provided a transducer 135 which includes circuitry by which the first transformer 130, the (180 degrees phase-shifted) second transformer 131, the third transformer 134 and the (180 degrees phase-shifted) fifth transformer 234 are connected in series. In addition, the transducer 135 includes circuitry by which the fourth transformer 136 and the (180 degrees phase-shifted) sixth transformer 236 are connected in series. The line voltage line 132 is also connected to the transducer 135.

Based on the information sensed, the transducer 135 generates a first signal and a second signal. The first signal has a magnitude which is proportional to the power being consumed by the site facility, the first signal being a series of pulses, the frequency of which is proportional to the magnitude of the power being consumed by the site facility. The second signal has a magnitude which is proportional to the sum of the power being produced by the first energy-producing system 118 and the second energy-producing system 218, the second signal being a series of pulses, the frequency of which is proportional to the sum of the magnitude of the power being produced by the first energy-producing system 118 and the magnitude of the power being produced by the second energy-producing system 218.

Figure 4:
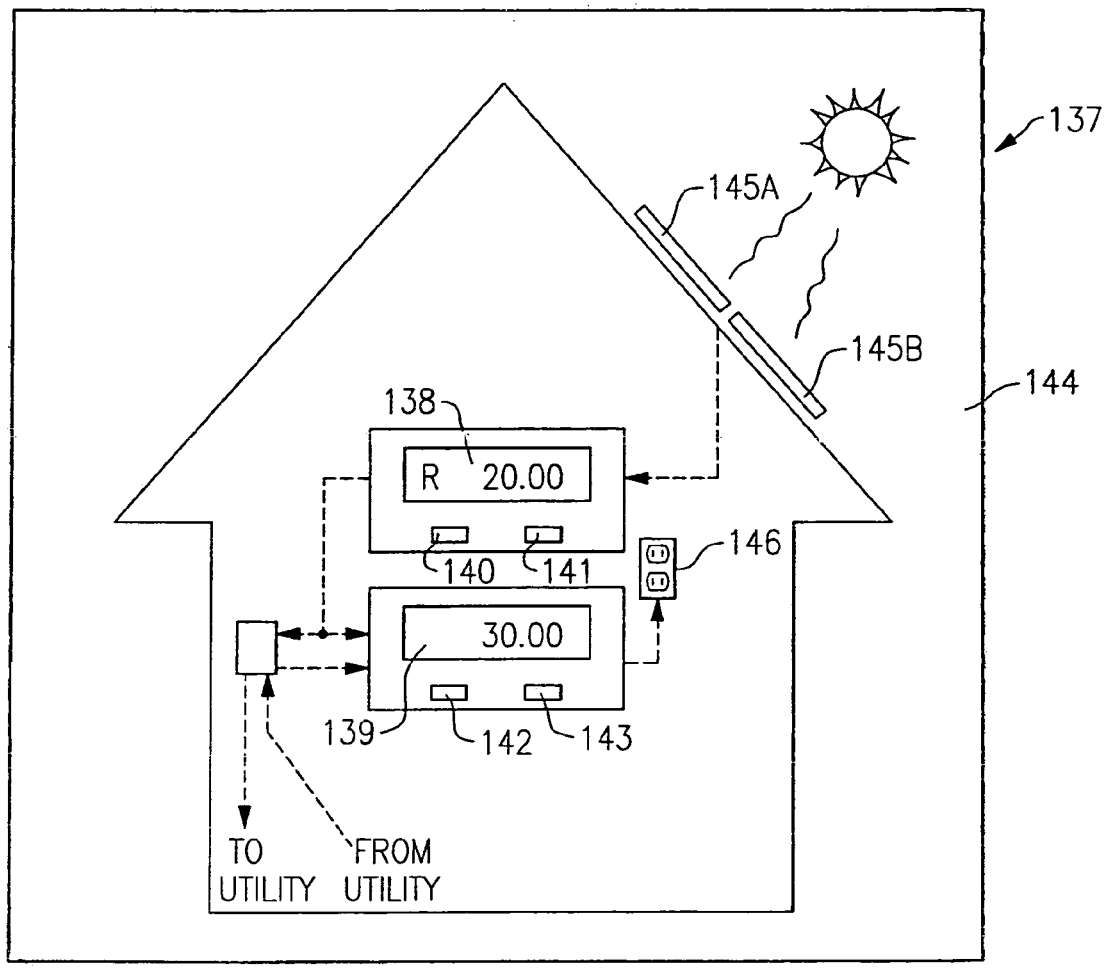
FIG. 4 depicts a display device according to the present invention which includes a solar-electric system production display area and a site facility consumption display area.

There is further provided a display device 137 (see FIG. 4) which includes a solar-electric system production display area 138 and a site facility consumption display area 139. In the display area 139, there is displayed the magnitude of power being consumed by the site facility (or the quantity of energy consumed over time). In the display area 138, there is displayed the combined total magnitude of power being produced by the first energy-producing system 118 and the second energy-producing system 218 (or the combined total quantity of energy produced over time). Similar to the first preferred embodiment, the display device 137 includes a solar-electric system power/energy production switch 140, a solar-electric system energy quantity reset button 141, a site facility power/energy consumption switch 142, a site facility energy quantity reset button 143, and mode indicators, and a mounting board 144 on which there is depicted (among other things) a first solar-electric system 145A and a second solar-electric system 145B, as well as an outlet 146.

Figure 5:
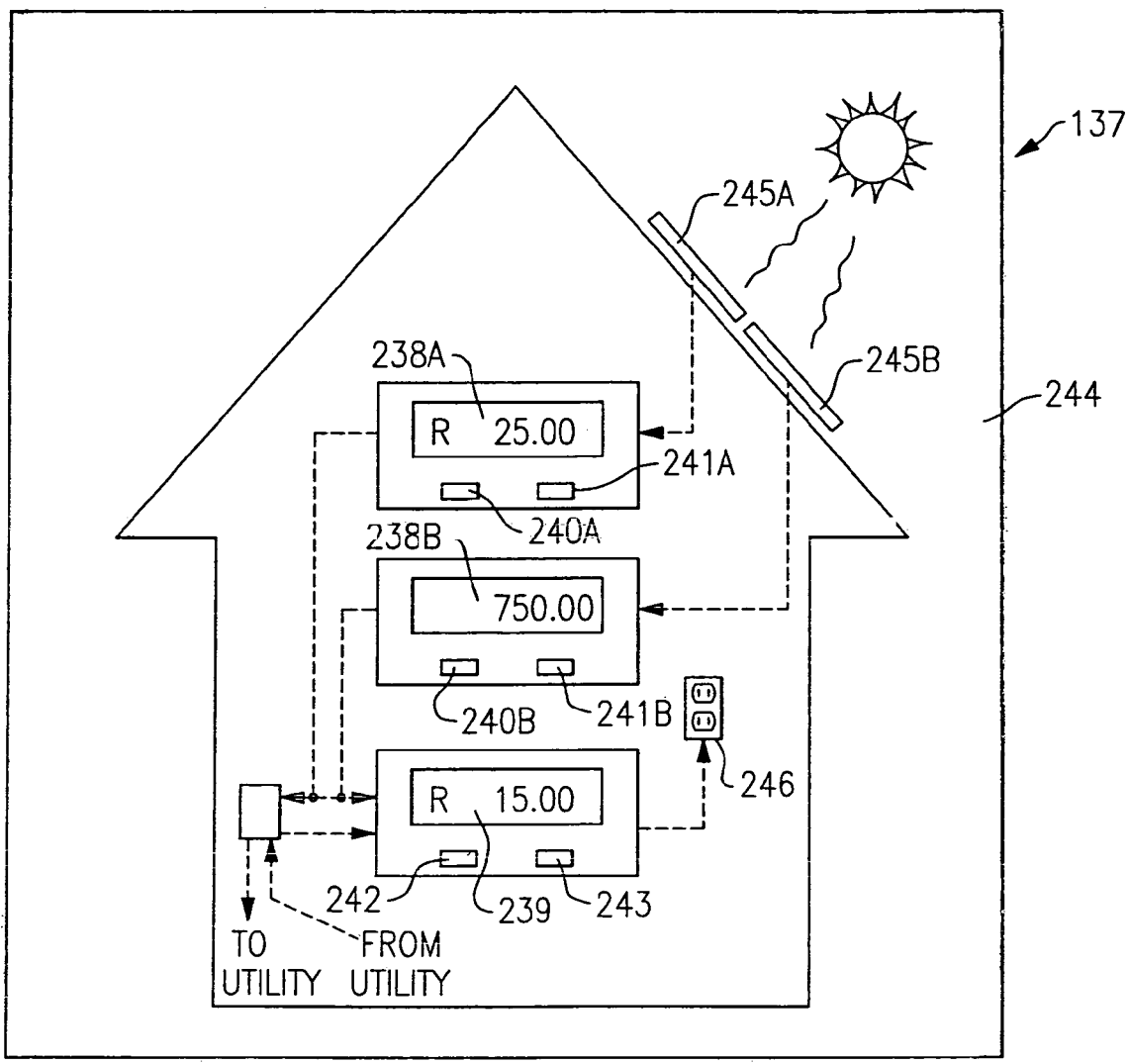
FIG. 5 depicts a display device according to the present invention which includes a first solar-electric system production display area, a second solar-electric system production display area and a site facility consumption display area.

Alternatively, as shown in FIG. 5, the display device 137 can include a first solar-electric system production display area 238A, a second solar-electric system production display area 238B and a site facility consumption display area 239. In the display area 238A, there is displayed the magnitude of power being produced by the first energy-producing system 118 (or the quantity of energy produced over time). In the display area 238B, there is displayed the magnitude of power being produced by the second energy-producing system 218 (or the quantity of energy produced over time). Similar to the display device shown in FIG. 4, in the display area 239, there is displayed the magnitude of power being consumed by the site facility (or the quantity of energy consumed over time). Similar to the embodiment shown in FIG. 4, the display device 137 includes a first solar-electric system power/energy production switch 240A and a solar-electric system energy quantity reset button 241A. In addition, the embodiment shown in FIG. 5 further includes a second solar-electric system power/energy production switch 240B and a second solar-electric system energy quantity reset button 241B. In addition, the embodiment shown in FIG. 5 further includes a site facility power/energy consumption switch 242 and a site facility energy quantity reset button 243. In addition, a mode indicator is provided in each display area. Also, the embodiment shown in FIG. 5 includes a mounting board 244 on which there is depicted (among other things) a first solar-electric system 245A and a second solar-electric system 245B, as well as a power load 246.

Figure 6:
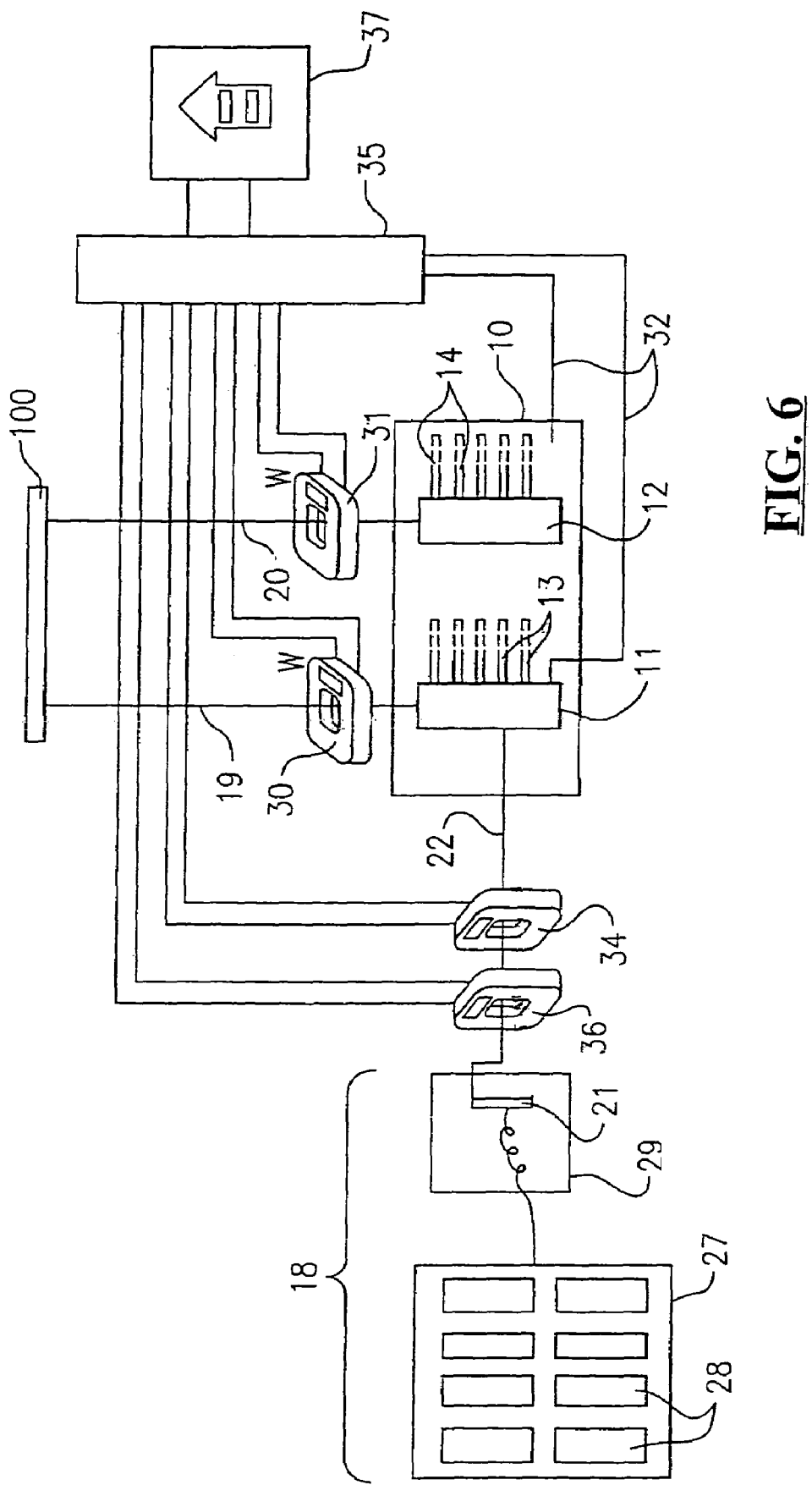
FIG. 6 is a schematic representation of a third preferred embodiment of the present invention.

FIG. 6 depicts a third preferred embodiment of the present invention. The third preferred embodiment is similar to the first preferred embodiment, except that in the third preferred embodiment, there is no critical load sub-panel 15 and no second internal power line 23. In FIG. 6, the reference numbers used to designate specific elements are identical to the reference numbers used to designate analogous elements depicted in FIG. 1. In this embodiment, analogous to the first preferred embodiment:

the first sensor senses the magnitude of power being consumed by the site facility;

the second sensor senses the magnitude of power being produced by the energy-producing system 18;

in order to sense the magnitude of power being consumed by the site facility, the first sensor senses the sum of (1) the total of all power passing from any external power source 100 to either of the main panel buses 11 and 12 through either of the external supply lines 19 and 20, and (2) the power passing from the energy-producing system 18 through the internal power line 22 which connects the energy-producing system bus 21 to the main panel bus 11.

In order to sense the magnitude of power being produced by the energy-producing system 18, the second sensor senses the power passing through the internal power line 22 which connects the energy-producing system bus 21 to the main panel bus 11.

Figure 7:
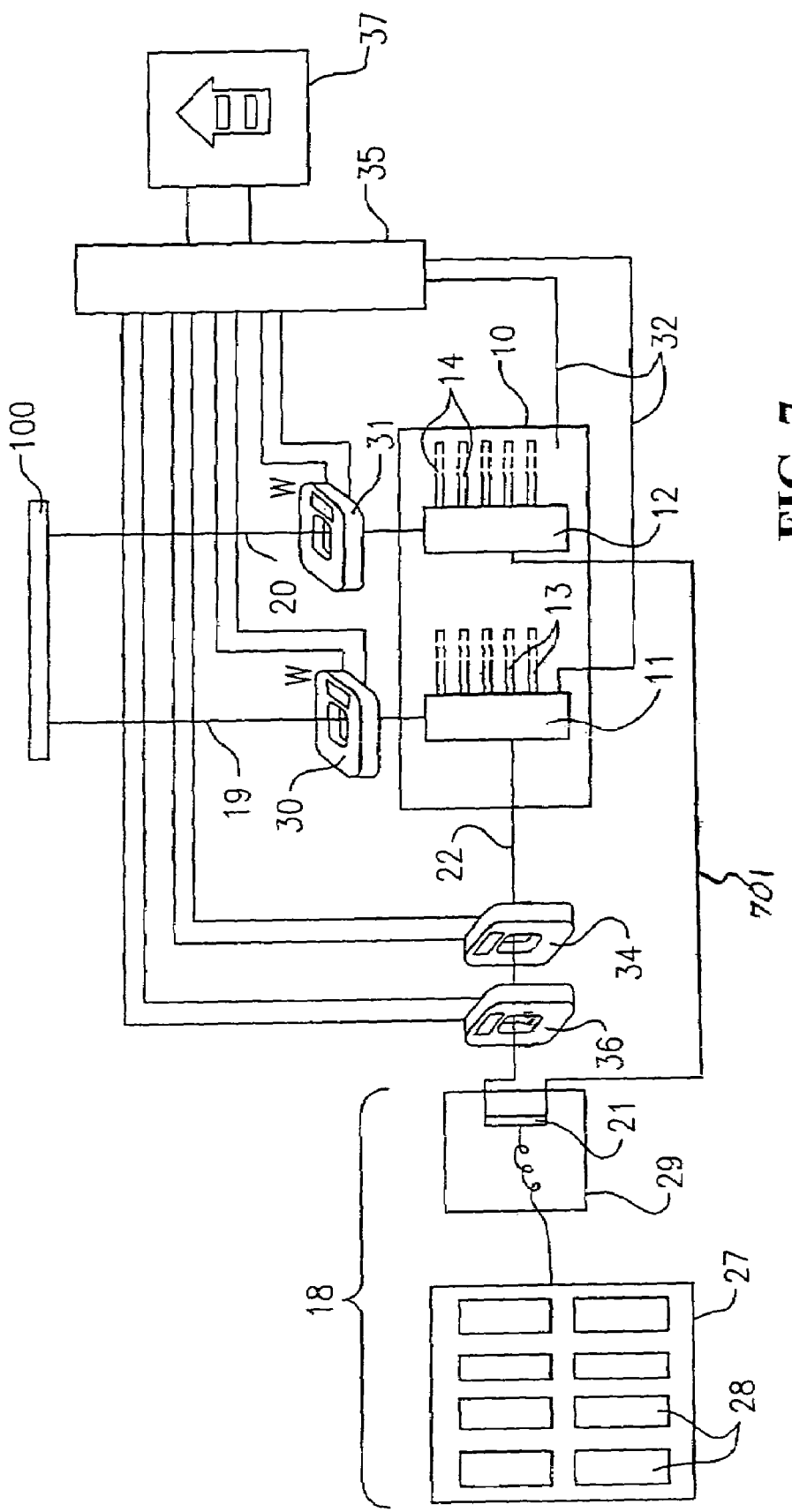
FIG. 7 is a schematic representation of a fourth preferred embodiment of the present invention.

FIG. 7 depicts a fourth preferred embodiment of the present invention. The fourth preferred embodiment is similar to the first preferred embodiment, except that in the fourth preferred embodiment, there is no critical load subpanel 15 and no second internal power line 23, and there is a second internal power line 701 connecting the energy-producing system 18 to the second main panel bus 12. In FIG. 7, the reference numbers used to designate specific elements are identical to the reference numbers used to designate analogous elements depicted in FIG. 1.

In this embodiment, the first and second power lines 19 and 20 are connected to opposite poles of a single split-phase external power source (i.e., the respective currents are 180 degrees out of phase), and the first and second internal power lines 22 and 701 are connected to opposite poles of a single split-phase energy-producing system 18 (i.e., the inverter 29 has two poles having current which is 180 degrees out of phase, and the first and second internal power lines 22 and 701 are each connected to one of the poles.

In this embodiment, analogous to the first preferred embodiment:

the first sensor senses the magnitude of power being consumed by the site facility;

the second sensor senses the magnitude of power being produced by the energy-producing system 18.

In order to sense the magnitude of power being consumed by the site facility, the first sensor senses the sum of (1) the total of all power passing from any external power source 100 to either of the main panel buses 11 and 12 through either of the external supply lines 19 and 20, and (2) two times the power passing from the energy-producing system 18 through the internal power line 22. In this embodiment, an assumption is made that the power passing through the internal power line 701 will be approximately equal to the power passing through the internal power line 22, and so the signal from the transformer 34 is doubled in the circuitry of the transducer 35.

In order to sense the magnitude of power being produced by the energy-producing system 18, the second sensor senses the power passing through the internal power line 22 and doubles it (i.e., the signal from the transformer 36 is doubled in the circuitry of the transducer 35.

If this embodiment were modified such that the current passing through the internal power lines 22 and 701 were in phase, both internal power lines 22 and 701 could be run through the transformers 34 and 36, and the signals could be added together in the transducer 35, rather than taking one signal and doubling it in the circuitry of the transducer 35.

In a preferred aspect of the present invention, there is further provided a maximum power point sensor which predicts the magnitude of power which should be being produced by any of the one or more energy-producing systems under the prevailing conditions and/or the quantity of energy which would have been produced by the energy-producing system over a period time under the conditions during that period of time. Any maximum power level sensor can be used for this purpose. A particularly preferred maximum power level sensor is disclosed in International Patent Application No. US02/25872, filed Aug. 13, 2002, entitled "Maximum Power Sensor for Photovoltaic System," (attorney docket no. 857_022 WO), the entirety of which is hereby incorporated by reference. Optionally, a further device (e.g., a microprocessor) may be provided for digitally comparing the actual power (and/or energy) being produced by one or more energy-producing system obtained according to the present invention with the estimated power (and/or energy) values for that (or those) energy-producing system(s). For example, a signal for estimated power can be fed into the device, which has logic to determine what power should be produced by the array. Such logic may include factors like inverter efficiency (typically in the range of from about 90% to about 93%). If the device detects that the actual power (and/or energy) is substantially lower than the estimated power (and/or energy), the device can perform any desired function, e.g., recording data, and/or using a phone line to report a problem (using a modem built into the device or into the overall apparatus, following which the service provider can immediately send one or more repair personnel to the site). For instance, where the energy-producing system is a solar-electric system, a lower value for actual power than estimated can indicate that one or more wires have come loose from the photovoltaic array, that the inverter is having a problem finding the optimum system voltage, a shading problem, a need to clean the array, etc.

As mentioned above, one or more energy storage devices (e.g., one or more batteries) may be employed, as is well known in any power system, in a manner which is well known to those of skill in the art. For example, one or more batteries may be electrically connected to an inverter which, as is well known in the art, can be constructed so as to charge or discharge the battery or batteries when appropriate. In general, in view of the comparatively small amount of power involved, it is not necessary to account for such power for purposes of the present invention, although, if desired, the battery could readily be connected such that power being used to charge the battery or batteries, or power deriving from discharge of the battery or batteries, could be accounted for.

Although the monitors, methods and display devices in accordance with the present invention have been described in connection with preferred embodiments, it will be appreciated by those skilled in the art that modifications not specifically described may be made without departing from the spirit and scope of the invention defined in the following claims. For example, any two or more structural parts of the monitors and/or display devices can be integrated; any structural part of the monitors and/or display devices can be provided in two or more parts (which can be held together, if necessary). Likewise, any parts of the methods according to the present invention can be combined, and any part of the methods can be divided into more than one part.

The invention claimed is:

1. A monitor comprising:
   a first sensor which senses a magnitude of power being consumed by a site facility, said site facility comprising at least one main panel bus, at least one external power line electrically connecting said at least one main panel bus to at least one external power source, at least one energy-producing system having at least one energy-producing system bus, at least one first internal power line electrically connecting said at least one main panel bus to said at least one energy-producing system bus, at least one critical load sub-panel bus, at least one second internal power line electrically connecting said at least one energy-producing system bus to said at least one critical load sub-panel bus;

said first sensor comprising at least one first sub-sensor and at least one second sub-sensor;

said first sub-sensor sensing a current passing through said at least one external power line;

said second sub-sensor sensing a net current passing through a combination comprising said at least one first internal power line and said at least one second internal power line; and a second sensor which senses a magnitude of power being produced by said at least one energy-producing system;

said second sensor comprising at least one third sub-sensor, said third sub-sensor sensing said net current passing trough said combination comprising said at least one first internal power line and said at least one second internal power line.

2. A monitor as recited in claim 1, wherein:

said first sub-sensor comprises at least a first transformer positioned around said at least one external power line;

said second sub-sensor comprises at least a second transformer positioned around said at least one first internal power line and said at least one second internal power line; and said third sub-sensor comprises at least a third transformer positioned around said at least one first internal power line and said at least one second internal power line.

3. A monitor as recited in claim 2, wherein:

said first transformer produces a first signal having a voltage which is proportional to said current passing through said at least one external power line;

said second transformer produces a second signal having a voltage which is proportional to said net current flowing through said combination comprising said at least one first internal power line and said at least one second internal power line; and said third transformer produces a third signal having a voltage which is proportional to said net current flowing through said combination comprising said at least one first internal power line and said at least one second internal power line;

said monitor further comprises at least one line voltage line which carries a line voltage signal having a voltage which is proportional to a voltage flowing through said at least one external power line, said at least one first internal power line and said at least one second internal power line; and said monitor further comprises at least one transducer, said at least one transducer comprising at least one circuit in which at least said first transformer and said second transformer are connected in series.

4. A monitor as recited in claim 1, further comprising a display device comprising at least one site facility consumption display area in which an indication of said magnitude of power being consumed by said site facility is displayed, and at least one energy-producing system production display area in which an indication of said magnitude of power being produced by said at least one energy-producing system is displayed.

5. A monitor as recited in claim 4, wherein said at least one transducer sends to said display device a first series of electronic pulses and a second series of electronic pulses, said first series of electronic pulses having a frequency which is indicative of said magnitude of power being consumed by said site facility, and said second series of electronic pulses having a frequency which is indicative of said magnitude of power being produced by said at least one energy-producing system.

6. A monitor as recited in claim 3, Thither comprising a display device comprising at least one site facility consumption display area in which an indication of energy consumed by said site facility over a period of time is displayed, and at least one energy-producing system production display area in which an indication of energy produced by said at least one energy-producing system over a period of time is displayed.

7. A monitor as recited in claim 6, wherein said at least one transducer sends to said display device a first series of electronic pulses and a second series of electronic pulses, a quantity of pulses in said first series of electronic pulses over a period of time being indicative of a quantity of energy consumed by said site facility over said period of time, and a quantity of pulses in said second series of electronic pulses over said period of time being indicative of a quantity of energy produced by said at least one energy-producing system in said period of time.

8. A monitor as recited in claim 3, further comprising a display device comprising at least one site facility consumption display area and at least one energy-producing system production display area, said display device further comprising a first switch which, when pressed, toggles between a setting where an indication of said magnitude of power being consumed by said site facility is displayed in said site facility consumption display area and a setting where an indication of energy consumed by said site facility over a period of time is displayed in said site facility consumption display area; and said display device further comprising a second switch which, when pressed, toggles between a setting where an indication of said magnitude of power being produced by said energy-producing system is displayed in said energy-producing system production display area and a setting where an indication of energy produced by said energy-producing system over a period of lime is displayed in said energy-producing system production display area.

9. A monitor as recited in claim 1, further comprising a display device comprising at least one site facility consumption display area in which an indication of energy consumed by said site facility over a period of time is displayed, and at least one energy-producing system production display area in which an indication of energy produced by said at least one energy-producing system over a period of time is displayed.

10. A monitor as recited in claim 1, further comprising a display device comprising at least one site facility consumption display area and at least one energy-producing system production display area, said display device further comprising a first switch which, when pressed, toggles between a setting where an indication of said magnitude of power being consumed by said site facility is displayed in said site facility consumption display area and a setting where an indication of energy consumed by said site facility over a period of time is displayed in said site facility consumption display area; and said display device further comprising a second switch which, when pressed, toggles between a setting where an indication of said magnitude of power being produced by said energy-producing system is displayed in said energy-producing system production display area and a setting where an indication of energy produced by said energy-producing system over a period of time is displayed in said energy-producing system production display area.

11. A monitor as recited in claim 1, further comprising at least a second external power line and at least a second main panel bus, said second external power line electrically connecting said second main panel bus to at least one external power source;

said first sensor comprising at least one fourth sub-sensor, said at least one fourth sub-sensor sensing a current passing through said second external power line, said fourth sub-sensor comprising a fourth transformer positioned around said second external power line, said monitor further comprising at least a second energy-producing system, at least a second critical load sub-panel bus, at least one third internal power line, and at least one fourth internal power line, said third internal power line electrically connecting said second main panel bus to said second energy-producing system bus, said at least one fourth internal power line electrically connecting said second energy-producing system bus to said second critical load sub-panel bus.

12. A monitor as recited in claim 11, wherein:

said first sensor further comprises at least one fourth sub-sensor and at least one fifth sub-sensor, said at least one fourth sub-sensor sensing current passing through said second external power line, said at least one fifth sub-sensor sensing current passing through a combination comprising said at least one third internal power line and said at least one fourth internal power line;

said second sensor further comprises at least one sixth sub-sensor, said at least one sixth sub-sensor sensing current passing through said combination comprising said at least one third internal power line and said at least one fourth internal power line.

13. A monitor as recited in claim 12, wherein:

said first sub-sensor comprises at least a first transformer positioned around said at least one external power line;

said second sub-sensor comprises at least a second transformer positioned around said at least one first internal power line and said at least one second internal power line;

said third sub-sensor comprises at least a third transformer positioned around said at least one first internal power line and said at least one second internal power line;

said fourth sub-sensor comprises at least a fourth transformer positioned around said second external power line;

said fifth sub-sensor comprises at least a fifth transformer positioned around said at least one third internal power line and said at least one fourth internal power line;

said sixth sub-sensor comprises at least a sixth transformer positioned around said at least one third internal power line and said at least one fourth internal power line.

14. A monitor as recited in claim 13, wherein:

said first transformer produces a first signal having a voltage which is proportional to said current passing through said at least one external power line;

said second transformer produces a second signal having a voltage which is proportional to said net current flowing through said combination comprising said at least one first internal power line and said at least one second internal power line;

said third transformer produces a third signal having a voltage which is proportional to said net current flowing through said combination comprising said at least one first internal power line and said at least one second internal power line;

said fourth transformer produces a fourth signal having a voltage which is proportional to said current passing through said second external power line;

said fifth transformer produces a fifth signal having a voltage which is proportional to said net current flowing through said combination comprising said at least one third internal power line and said at least one fourth internal power line; and said sixth transformer produces a sixth signal having a voltage which is proportional to said net current flowing through said combination comprising said at least one third internal power line and said at least one fourth internal power line;

said monitor further comprises at least one line voltage line which carries a line voltage signal having a voltage which is proportional to a voltage flowing through at least one line selected from the group consisting of said at least one external power line, said at least one first internal power line, said at least one second internal power line, said second external power line, said at least one third internal power line and said at least one fourth internal power line; and said monitor further comprises at least one transducer, said at least one transducer comprising at least a first circuit in which at least said first transformer, said second transformer, said fourth transformer and said fifth transformer are connected in series and a second circuit in which at least said third transformer and said sixth transformer are connected in series.

15. A facility comprising:

at least one main panel bus;

at least one external power line electrically connecting said at least one main panel bus to at least one external power source;

at least one energy-producing system having at least one energy-producing system bus;

at least one first internal power line electrically connecting said at least one main panel bus to said at least one energy-producing system bus;

at least one critical load sub-panel bus;

at least one second internal power line electrically connecting said at least one energy-producing system bus to said at least one critical load sub-panel bus;

a first sensor which senses a magnitude of power being consumed by said facility; and a second sensor which senses a magnitude of power being produced by said at least one energy-producing system, said first sensor comprising at least one first sub-sensor and at least one second sub-sensor;

said first sub-sensor sensing a current passing through said at least one external power line;

said second sub-sensor sensing a net current passing through a combination comprising said at least one first internal power line and said at least one second internal power line;

said second sensor comprising at least one third sub-sensor, said third sub-sensor sensing said net current passing through said combination comprising said at least one first internal power line and said at least one second internal power line.

16. A method of sensing power in a site facility, comprising:

sensing a magnitude of power being consumed by a site facility by:

sensing current passing through at least one external power line, said at least one external power line electrically connecting at least one main panel bus to at least one external power source, and sensing net current passing through a combination comprising at least one first internal power line and at least one second internal power line, said at least one first internal power line electrically connecting said at least one main panel bus to at least one energy-producing system bus, said at least one second internal power line electric ally connecting said at least one energy-producing system bus to at least one critical load sub-panel bus; and sensing a magnitude of power being produced by said at least one energy-producing system by:

sensing said net current passing through said combination comprising said at least one first internal power line and said at least one second internal power line.

17. A display device comprising:

at least one site facility consumption display area;

at least one energy-producing system production display area; and a first switch which, when pressed, toggles between a setting where an indication of a magnitude of power being consumed by a site facility is displayed in said site facility consumption display area and a setting where an indication of energy consumed by said site facility over a period of time is displayed in said site facility consumption display area; and a second switch which, when pressed, toggles between a setting where an indication of a magnitude of power being produced by said energy-producing system is displayed in said energy-producing system production display area and a setting where an indication of energy produced by said energy-producing system over a period of rime is displayed in said energy-producing system production display area.

18. A monitor comprising:

a first sensor which senses a magnitude of a first net current passing through at least a first power line and which generates a first signal having a voltage which is proportional to said first net current;

a second sensor which senses a magnitude of a second net current passing through at least a second power line and which generates a second signal having a voltage which is proportional to said second net current; and a transducer comprising at least one circuit in which said first sensor and said second sensor are connected in series.

19. A monitor comprising:

a first sensor which senses a magnitude of power being consumed by a site facility, said site facility comprising at least one main panel bus, at least one external power line electrically connecting said at least one main panel bus to at least one external power source, at least one energy-producing system having at least one energy-producing system bus, at least one first internal power line electrically connecting said at least one main panel bus to said at least one energy-producing system bus;

said first sensor comprising at least one first sub-sensor and at least one second sub-sensor;

said first sub-sensor sensing a current passing through said at least one external power line;

said second sub-sensor sensing a current passing through said at least one first internal power line; and a second sensor which senses a magnitude of power being produced by said at least one energy-producing system;

said second sensor comprising at least one third sub-sensor, said third sub-sensor sensing said current passing through said at least one first internal power line.

* * * * *

UNITED STATES PATENT AND TRADEMARK OFFICE
CERTIFICATE OF CORRECTION

PATENT NO. : 7,183,669 B2
APPLICATION NO. : 10/776922
DATED : February 27, 2007
INVENTOR(S) : Jason Schripsema et al.

It is certified that error appears in the above-identified patent and that said Letters Patent is hereby corrected as shown below:

Column 7
    *Line 42*: please change "DRAWINGS" to --DRAWING--

Column 23
    *Line 22*: please change "trough" to --through--

Column 24
    *Line 10*: please change "Thither" to --further--
    *Line 46*: please change "lime" to --time--

Column 27
    *Line 24*: please change "electric ally" to --electrically--

Column 28
    *Line 28*: please change "rime" to --time--

Signed and Sealed this

Twenty-fourth Day of April, 2007

JON W. DUDAS
*Director of the United States Patent and Trademark Office*